(12) United States Patent
Itakura

(10) Patent No.: US 10,163,789 B2
(45) Date of Patent: Dec. 25, 2018

(54) SEMICONDUCTOR DEVICE AND DISPLAY DEVICE

(71) Applicant: JOLED INC., Tokyo (JP)

(72) Inventor: Shunsuke Itakura, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/718,619

(22) Filed: Sep. 28, 2017

(65) Prior Publication Data

US 2018/0096929 A1 Apr. 5, 2018

(30) Foreign Application Priority Data

Oct. 4, 2016 (JP) .................................. 2016-196713

(51) Int. Cl.
| | | |
|---|---|---|
| H01L 23/34 | (2006.01) | |
| H01L 23/528 | (2006.01) | |
| H01L 27/118 | (2006.01) | |
| H01L 25/16 | (2006.01) | |
| H01L 23/00 | (2006.01) | |
| G09G 5/10 | (2006.01) | |
| H01L 49/02 | (2006.01) | |
| H01L 23/50 | (2006.01) | |
| H01L 25/18 | (2006.01) | |

(52) U.S. Cl.
CPC ............ *H01L 23/528* (2013.01); *G09G 5/10* (2013.01); *H01L 23/50* (2013.01); *H01L 24/17* (2013.01); *H01L 25/16* (2013.01); *H01L 25/18* (2013.01); *H01L 27/11803* (2013.01); *H01L 28/40* (2013.01); *G09G 2330/021* (2013.01); *H01L 2224/1713* (2013.01); *H01L 2924/14* (2013.01); *H01L 2924/1433* (2013.01); *H01L 2924/1434* (2013.01); *H01L 2924/15192* (2013.01); *H01L 2924/19041* (2013.01); *H01L 2924/19105* (2013.01)

(58) Field of Classification Search
CPC ....... H01L 23/50; H01L 23/528; H01L 24/17; H01L 25/16; H01L 27/11803; H01L 28/40
USPC ......................................................... 257/723
See application file for complete search history.

(56) References Cited

U.S. PATENT DOCUMENTS 9,390,766 B2 * 7/2016 Yoshikawa ............ G11C 5/063
9,557,355 B2 * 1/2017 Swoboda ......... G01R 19/16552
(Continued)

FOREIGN PATENT DOCUMENTS

| JP | 2008-135772 | 6/2008 |
|---|---|---|
| JP | 2012-169468 | 9/2012 |
| WO | 2006/018939 | 2/2006 |

*Primary Examiner* — Luan C Thai
(74) *Attorney, Agent, or Firm* — Greenblum & Bernstein, P.L.C.

(57) ABSTRACT

Provided is a semiconductor device that includes: an integrated circuit (IC) chip including a terminal array that is a matrix of terminals arranged in at least seven rows and at least seven columns, the terminals including a reference terminal to which a reference voltage is applied; a capacitor electrically connected to the reference terminal; and a substrate including one main surface as a mounting surface on which the IC chip and the capacitor are mounted. The IC chip is an application specific integrated circuit (ASIC) chip or a field-programmable gate array (FPGA) chip. The reference terminal is disposed at a position within three rows or three columns from an outer edge of the terminal array.

7 Claims, 8 Drawing Sheets

(56) References Cited

U.S. PATENT DOCUMENTS

2007/0262448 A1 11/2007 Ishino
2012/0206954 A1 8/2012 Yoshikawa et al.

* cited by examiner

SEMICONDUCTOR DEVICE AND DISPLAY DEVICE

CROSS REFERENCE TO RELATED APPLICATION

The present application is based on and claims priority of Japanese Patent Application No. 2016-196713 filed on Oct. 4, 2016. The entire disclosure of the above-identified application, including the specification, drawings and claims is incorporated herein by reference in its entirety.

FIELD

The present disclosure relates to a semiconductor device including a substrate having an integrated circuit (IC) chip mounted thereon, and a display device including the semiconductor device.

BACKGROUND

In recent years, semiconductor devices in which an IC chip including, for example, a semiconductor integrated circuit, is mounted on a substrate have been used in various electronic devices. For example, since IC chips, such as application specific integrated circuit (ASIC) chips and field-programmable gate array (FPGA) chips, have integrated functions, the IC chips include a large number of input/output terminals. Such IC chips including a large number of input/output terminals adopt a terminal array configuration in which terminals are arranged in a matrix, in order to reduce the mounting area. An example of such IC chips is an IC chip including memory such as dynamic random access memory (DRAM). Not only data input/output signals but a reference voltage used for the memory is also applied to the IC chip including memory. The reference voltage is used in the memory as a threshold for determining whether a signal voltage is at high level or low level. Thus, fluctuations of the reference voltage caused by, for example, noise causes malfunction of the memory chip. Furthermore, when comparing the signal voltage and the reference voltage in the memory, a current caused by the signal voltage flows as noise into an interconnection used for reference voltage supply, every time the signal voltage swings. Therefore, a countermeasure against an adverse effect of noise on the reference voltage becomes particularly important. In view of this, a configuration in which a capacitor is connected between a terminal of the IC chip to which the reference voltage is applied and a patterned ground conductor has been adopted in order to reduce noise contained in the reference voltage. With this configuration, when there is an increase in the distance between the capacitor and the terminal of the IC chip to which the reference voltage is applied, the impedance of the interconnection between the IC chip and the capacitor increases. As a result, the noise reduction effect brought about by the capacitor is reduced.

In view of this, a technique has been proposed for mounting a capacitor on the back surface of a substrate opposite a main surface thereof on which an IC chip is mounted, and connecting the IC chip and the capacitor via a via interconnection (see Patent Literature 1, for example). This is in an attempt to reduce the impedance of the interconnection between the IC chip and the capacitor by reducing the distance between the IC chip and the capacitor.

CITATION LIST

Patent Literature

[Patent Literature 1] Japanese Unexamined Patent Application Publication No. 2008-435772

SUMMARY

Technical Problem

However, this configuration in which the capacitor is mounted on the back surface of the substrate requires a larger space in the thickness direction of the substrate, for disposing the semiconductor device. This could hinder application of the semiconductor device to electronic devices that are required to be smaller in size and thickness.

The present disclosure has been conceived in view of the above problem, and provides a semiconductor device that includes: a substrate; and an IC chip and a capacitor which are mounted only on one main surface of the substrate, and that can reduce the impedance of an interconnection between the capacitor and a terminal of the IC chip to which a reference voltage is applied. The present disclosure also provides a display device including the semiconductor device.

Solution to Problem

In order to achieve the above object, the semiconductor device according to an aspect of the present disclosure is a semiconductor device that includes: an IC chip including a terminal array that is a matrix of terminals arranged in at least seven rows and at least seven columns, the terminals including a reference terminal to which a reference voltage is applied; a capacitor electrically connected to the reference terminal; and a substrate including one main surface as a mounting surface on which the IC chip and the capacitor are mounted, wherein the IC chip is an ASIC chip or an FPGA chip, and the reference terminal is disposed at a position within three rows or three columns from an outer edge of the terminal array.

Moreover, in order to achieve the above object, a display device according to an aspect of the present disclosure includes the semiconductor device described above.

Advantageous Effects

According to the present disclosure, it is possible to provide a semiconductor device that includes: a substrate; and an IC chip and a capacitor which are mounted only on one main surface of the substrate, and that can reduce the impedance of an interconnection between the capacitor and a terminal of the IC chip to which a reference voltage is applied. The present disclosure makes it possible to also provide a display device including the semiconductor device.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS

Hereinafter, embodiments of the present disclosure will be described with reference to the drawings. Note that each of the embodiments described below shows a specific example of the present disclosure. Therefore, the numerical values, shapes, materials, structural elements, the arrangement and connection of the structural elements, steps, the processing order of the steps, etc., illustrated in the following embodiments are mere examples, and are therefore not intended to limit the present disclosure. As such, among the structural elements in the following embodiments, structural elements not recited in any one of the independent claims which indicate the broadest inventive concepts will be described as arbitrary structural elements.

Note that each drawing is a schematic illustration and not necessarily a precise illustration. Further, essentially the same structural elements are given the same reference signs in the figures, and overlapping descriptions thereof will be omitted or simplified.

Embodiment 1

[1-1. Overall Configuration]

A semiconductor device according to Embodiment 1 will be described. First, the overall configuration of the semiconductor device according to the present embodiment will be described with reference to the drawings.

Figure 1:
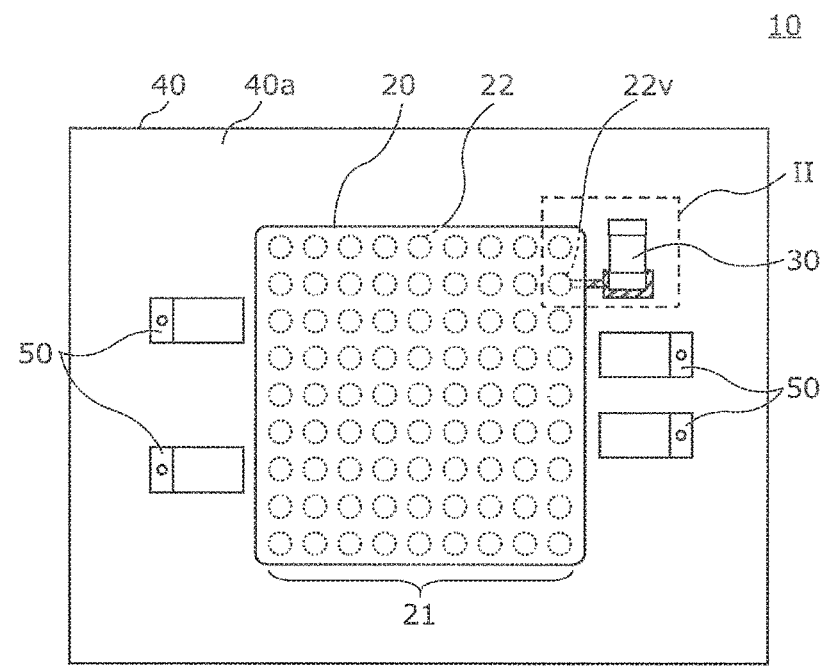
FIG. 1 is a top view illustrating the overall configuration of a semiconductor device according to Embodiment 1.

FIG. 1 is a top view illustrating the overall configuration of a semiconductor device 10 according to the present embodiment.

As illustrated in FIG. 1, the semiconductor device 10 according to the present embodiment includes an IC chip 20, a capacitor 30, and a substrate 40. The semiconductor device 10 further includes regulators 50. In the present embodiment, the semiconductor device 10 includes four regulators 50.

The semiconductor device 10 is an electronic module having a predetermined processing function. The processing function of the semiconductor device 10 is not particularly limited. The semiconductor device 10 may have, for example, an image processing function.

The substrate 40 is a plate-shaped component having one main surface as a mounting surface 40a on which the IC chip 20 and the capacitor 30 are mounted. Note that in the present embodiment, the regulators 50 are further mounted on the substrate 40. In the present embodiment, all elements such as the IC chip 20 are mounted on the mounting surface 40a of the substrate 40. That is to say, the semiconductor device 10 achieves single-sided mounting.

In the present embodiment, a multilayered printed board, for example, is used as the substrate 40; however, the structure, material, etc., of the substrate 40 are not particularly limited, as long as the elements such as the IC chip 20 can be mounted. The substrate 40 includes, for example, a plurality of insulating layers made of an insulating material such as glass epoxy. Each of the insulating layers may have, for example, a patterned conductor made of an electrically-conductive material such as copper. Further, the substrate 40 may have a via interconnection passing through the insulating layers.

Each regulator 50 is a constant voltage generation circuit that outputs a reference voltage to the IC chip 20. Each regulator 50 converts a voltage received from outside into a reference voltage, and outputs the reference voltage. The reference voltage is, for example, a direct-current voltage used as a threshold in memory such as DRAM for determining whether a signal voltage is at high level or low level. The magnitude of the reference voltage is, but not particularly limited to, approximately 0.5 V, for example. Each regulator 50 may output a voltage other than the reference voltage. In this case, the IC chip 20 may be supplied with the reference voltage from, for example, a power source outside the semiconductor device 10.

The IC chip 20 is an element: including a terminal array 21 that is a matrix of terminals 22 arranged in at least seven rows and at least seven columns, and the terminals 22 include a reference terminal 22v to which the reference voltage is applied. The plurality of terminals 22 making up the terminal array 21 need not be arranged in a matrix in a strict sense. For example, the number of terminals 22 making up one row or column may be less than the number of terminals 22 making up another row or column. It is only necessary for the plurality of terminals 22 to be arranged in a matrix approximately. Each of the terminals 22 making up the terminal array 21 may be, for example, a solder ball. The IC chip 20 has the terminal array 21 on a surface of the IC chip 20 opposed to the substrate 40.

In the present embodiment, the IC chip 20 is an ASIC chip or an FPGA chip. Note that the IC chip 20 may include memory such as DRAM, and may communicate with external memory. At least one terminal among the plurality of terminals 22 making up the terminal array 21 is the reference terminal 22v to which the reference voltage is applied. The reference voltage used as a threshold in the memory is applied to the reference terminal 22v by the regulators 50.

The capacitor 30 is a capacitive element electrically connected to the reference terminal 22v of the IC chip 20. For example, the capacitor 30 includes two terminals, one being electrically connected to the reference terminal 22v and the other being grounded. That is to say, the capacitor 30 functions as a bypass capacitor for reducing the noise contained in the reference voltage. Note that the capacitor 30 may include three or more terminals. The capacitor 30 is not particularly limited as long as it is a capacitor having a property to function as a bypass capacitor. In the present embodiment, the capacitor 30 is a chip capacitor that is surface-mounted on the substrate 40.

The configuration of the semiconductor device 10 is not limited to the configuration described above. For example, the semiconductor device 10 may include a plurality of capacitors 30, and may include not only the capacitor 30 but also a different capacitor. Moreover, the semiconductor device 10 need not include the regulators 50. In this case, the semiconductor device 10 may receive power from outside. Furthermore, the semiconductor device 10 may include a plurality of IC chips 20, and may include not only the IC chip 20 but also a different IC chip.

[1-2. Connection Between IC Chip and Capacitor]

The connection between the IC chip 20 and the capacitor 30 will be described with reference to the drawings.

Figure 2:
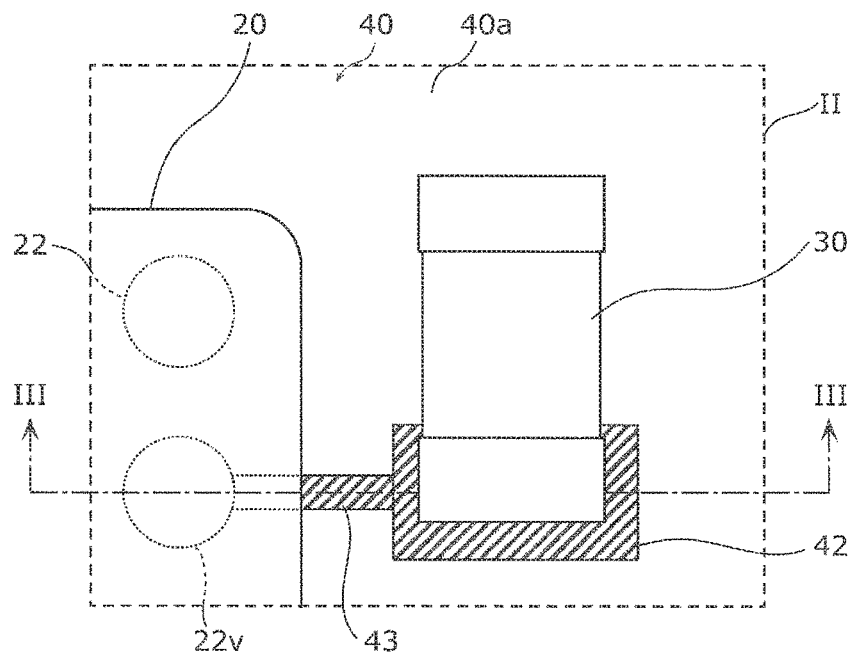
FIG. 2 is a partially enlarged top view of the semiconductor device according to Embodiment 1.
Figure 3:
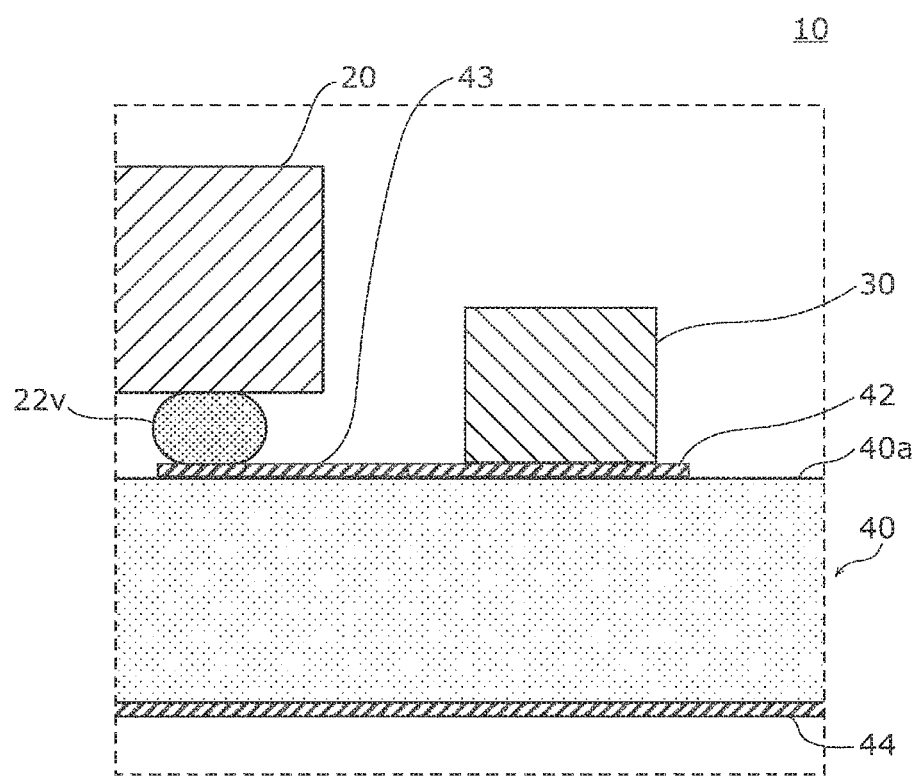
FIG. 3 is a partially enlarged cross sectional view of the semiconductor device according to Embodiment 1.
Figure 4:
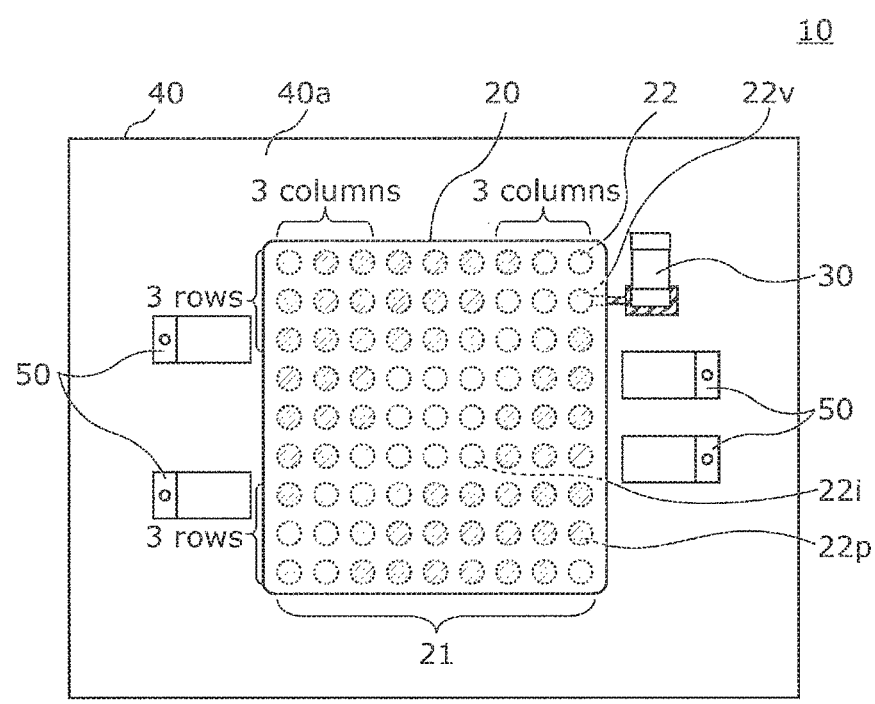
FIG. 4 illustrates possible positions of a reference terminal in an IC chip according to Embodiment 1.

FIG. 2 is a partially enlarged top view of the semiconductor device 10 according to the present embodiment. FIG. 3 is a cross sectional view of the semiconductor device 10 according to the present embodiment. FIG. 2 is an enlarged view of the region defined by the dashed-lined frame II illustrated in FIG. 1. FIG. 3 illustrates a cross section taken along line in FIG. 2. FIG. 4 illustrates possible positions of the reference terminal 22v in the IC chip 20 according to the present embodiment.

As illustrated in FIG. 2 and FIG. 3, the reference terminal 22v of the IC chip 20 and the capacitor 30 are electrically connected via a patterned conductor 43 disposed on the mounting surface 40a. This allows the length of the interconnection between the reference terminal 22v and the capacitor 30 to be shorter than in the case of using, for example, a patterned conductor disposed inside the substrate 40 and a via interconnection connecting the reference terminal 22v and the patterned conductor. Accordingly, it is possible to reduce the impedance of the interconnection between the reference terminal 22v and the capacitor 30. In the present embodiment, the capacitor 30 is electrically connected to the patterned conductor 43 via a pad electrode 42. The patterned conductor 43 is an electrically-conductive film disposed on the mounting surface 40a of the substrate 40. The pad electrode 42 is an electrically-conductive film which is disposed on the mounting surface 40a of the substrate 40, and to which a terminal of the capacitor 30 is electrically connected. Note that, as illustrated in FIG. 3, a patterned ground conductor 44 may be disposed on the surface of substrate 40 opposite the mounting surface 40a. The patterned ground conductor 44 is a grounded electrically-conductive film, and is electrically connected with a ground terminal of each element mounted on the substrate 40. The materials of the pad electrode 42, the patterned conductor 43, and the patterned ground conductor 44 are not particularly limited as long as they are electrically-conductive materials, and may be copper, for example.

The reference terminal 22v is disposed at a position within three rows or three columns from the outer edge of the terminal array 21. That is to say, it is only necessary for the reference terminal 22v to be one of hatched terminals 22p in the terminal array 21 of the IC chip 20 illustrated in FIG. 4. In other words, the reference terminal 22v is not disposed in positions in the fourth and subsequent rows and the fourth and subsequent columns from the outer edge of the terminal array 21. That is to say, unhatched terminals 22i in the terminal array 21 of the IC chip 20 illustrated in FIG. 4 are not used as the reference terminal 22v.

As described above, the reference terminal 22v is disposed at a position relatively close to the outer edge of the IC chip 20. Thus, even in the case where the capacitor 30 is mounted on the mounting surface 40a of the substrate 40 on which the IC chip 20 is mounted, it is possible to reduce the distance between the reference terminal 22v and the capacitor 30 disposed in the vicinity of the outer edge of the IC chip 20. Accordingly, it is possible to reduce the impedance of the interconnection electrically connecting the reference terminal 22v and the capacitor 30.

In the present embodiment, as illustrated in FIG. 1 to FIG. 4, the reference terminal 22v is disposed in the first column from the outer edge of the terminal array 21. With this, it is possible to minimize the length of the patterned conductor 43 between the reference terminal 22v and the capacitor 30.

Further, a portion, of the interconnection electrically connecting the reference terminal 22v and the capacitor 30, which is parallel to the mounting surface 40a is disposed in a path connecting one end and the other end of that portion in the shortest distance. In the present embodiment, the patterned conductor 43 parallel to the mounting surface 40a is linearly disposed between one end of the patterned conductor 43 corresponding to the position of the reference terminal 22v and the other end of the patterned conductor 43 corresponding to the position of the pad electrode 42. Note that the "path connecting in the shortest distance" is not necessarily limited to a linear path. For example, if an obstacle to be circumvented is located on a The segment connecting the one end and the other end of the patterned conductor 43, the "path connecting in the shortest distance" is a shortest path among paths connecting the one end and the other end while circumventing the obstacle. By minimizing the length of the interconnection between the reference terminal 22v and the capacitor 30 as described above, the impedance of the interconnection can be further reduced.

[1-3. Variations]

In the present embodiment, the reference terminal 22v is disposed in the first column from the outer edge of the terminal array 21 as illustrated in FIG. 1 to FIG. 4; however, the position of the reference terminal 22v is not limited to this. Hereinafter, other examples of the position of the reference terminal 22v according to the present embodiment will be described with reference to the drawings.

Figure 5:
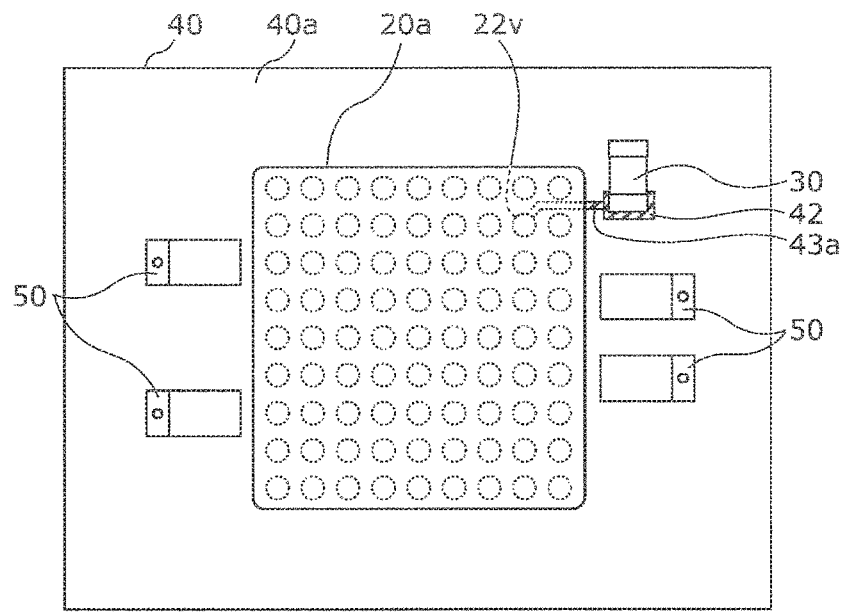
FIG. 5 is a top view illustrating the overall configuration of a semiconductor device according to Variation 1 of Embodiment 1.
Figure 6:
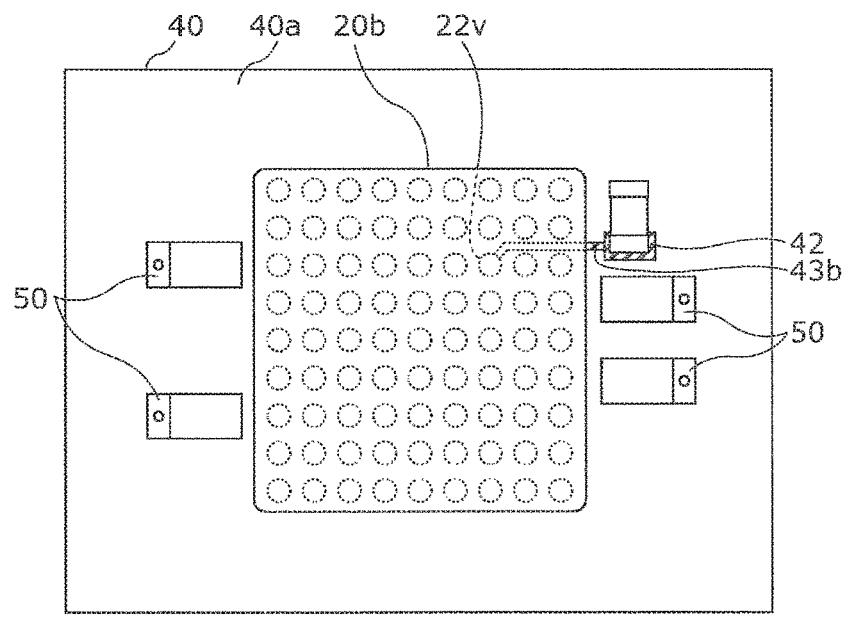
FIG. 6 is a top view illustrating the overall configuration of a semiconductor device according to Variation 2 of Embodiment 1.

FIG. 5 is a top view illustrating the overall configuration of a semiconductor device 10a according to Variation 1 of the present embodiment. FIG. 6 is a top view illustrating the overall configuration of a semiconductor device 10b according to Variation 2 of the present embodiment.

In the semiconductor device 10a according to Variation 1 illustrated in FIG. 5, the reference terminal 22v is disposed in the second column from the outer edge of the terminal array 21 of an IC chip 20a. In the present variation, the reference terminal 22v and the pad electrode 42 are electrically connected by a patterned conductor 43a. In the semiconductor device 10b according to Variation 2 illustrated in FIG. 6, the reference terminal 22v is disposed in the third column from the outer edge of the terminal array 21 of an IC chip 20b. In the present variation, the reference terminal 22v and the pad electrode 42 are electrically connected by a patterned conductor 43b. In these variations too, the reference terminal 22v is disposed at a position within three rows or three columns from the outer edge of the terminal array 21. This allows the distance between the reference terminal 22v and the capacitor 30 to be shorter than in the case of, for example, disposing the reference terminal 22v at a position in one of the fourth and subsequent rows and one of the fourth and subsequent columns from the outer edge of the terminal array 21. Accordingly, it is possible to reduce the impedance of the interconnection electrically connecting the reference terminal 22v and the capacitor 30.

[1-4. Conclusion]

As described above, the semiconductor device 10 according to the present embodiment includes the IC chip 20 including the terminal array 21 that is a matrix of terminals 22 arranged in at least seven rows and at least seven columns, and the terminals 22 include the reference terminal 22v to which the reference voltage is applied. The semiconductor device 10 further includes: the capacitor 30 electrically connected to the reference terminal 22v; and the substrate 40 having one main surface as the mounting surface 40a on which the IC chip 20 and the capacitor 30 are mounted. Here, the IC chip 20 is an ASIC chip or an FPGA chip, and the reference terminal 22v is disposed at a position within three rows or three columns from the outer edge of the terminal array 21.

With this, it is possible to reduce the distance between the reference terminal 22v and the capacitor 30 even in the case where the capacitor 30 is mounted on the mounting surface 40a of the substrate 40 on which the IC chip 20 is mounted. Accordingly, it is possible to reduce the impedance of the interconnection electrically connecting the reference terminal 22v and the capacitor 30. This leads to reduction of the noise contained in the reference voltage applied to the reference terminal 22v, thereby allowing, for example, memory that uses the reference voltage, to operate stably.

In the semiconductor device 10, the reference terminal 22v and the capacitor 30 may be connected via the patterned conductor 43 disposed on the mounting surface 40a.

This allows the length of the interconnection between the reference terminal 22v and the capacitor 30 to be shorter than in the case of using, for example, the patterned conductor disposed inside the substrate 40 and a via interconnection connecting the reference terminal 22v and the patterned conductor. Accordingly, it is possible to reduce the impedance of the interconnection between the reference terminal 22v and the capacitor 30.

Embodiment 2

A semiconductor device according to Embodiment 2 will be described. The present embodiment adopts a configuration that enables reduction of the impedance of the interconnection between the reference terminal and the capacitor, in a semiconductor device in which the reference terminal of the IC chip is disposed at a position in one of the fourth and subsequent rows and one of the fourth and subsequent columns from the outer edge of the terminal array. Hereinafter, the semiconductor device according to the present embodiment will be described with reference to the drawings, focusing on the difference from the semiconductor device 10 according to Embodiment 1.

Figure 7:
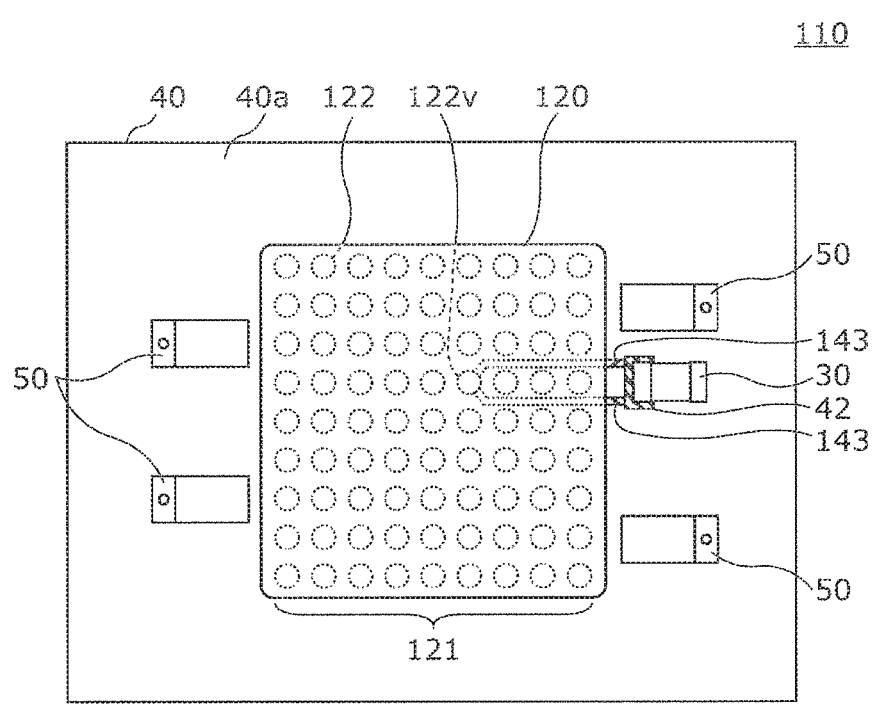
FIG. 7 is a top view illustrating the overall configuration of a semiconductor device according to Embodiment 2.

FIG. 7 is a top view illustrating the overall configuration of a semiconductor device 110 according to the present embodiment.

As illustrated in FIG. 7, similar to the semiconductor device 10 according to Embodiment 1, the semiconductor device 110 according to the present embodiment includes an IC chip 120, the capacitor 30, and the substrate 40. The semiconductor device 110 further includes four regulators 50. In the present embodiment too, the IC chip 120, the capacitor 30, and the regulators 50 are mounted on the mounting surface 40a of the substrate 40.

Similar to the IC chip 20 according to Embodiment 1, the IC chip 120 is an element including a terminal array 121 that is a matrix of terminals 122 arranged in at least seven rows and at least seven columns, and the terminals 122 include a reference terminal 122v to which the reference voltage is applied. The IC chip 120 is different from the IC chip 20 according to Embodiment 1 in that the reference terminal 122v is disposed at a position in one of the fourth and subsequent rows and one of the fourth and subsequent columns from the outer edge of the terminal array 121. In the present embodiment, the reference terminal 122v is disposed at a position in the fourth row and the fourth column from the outer edge of the terminal array 121. Thus, the distance between the reference terminal 122v and the capacitor 30 is greater than the distance between the reference terminal 22v and the capacitor 30 according to Embodiment 1.

In such a configuration as described above in which the distance between the reference terminal 122v and the capacitor 30 is great, the reference terminal 122v and the capacitor 30 in the present embodiment are connected via a plurality of parallel interconnections connected in parallel, in order to reduce the impedance of the interconnections connecting the reference terminal 122v and the capacitor 30. Specifically, two patterned conductors 143 disposed on the mounting surface 40a of the substrate 40 are used as the parallel interconnections. One end portion of each of the two patterned conductors 143 is connected to the reference terminal 122v, and the other end portion is connected to the pad electrode 42. With this, the impedance of the interconnections between the reference terminal 122v and the capacitor 30 can be reduced to a greater extent as compared to the case of connecting the reference terminal 122v and the pad electrode 42 using a single patterned conductor. Note that although two patterned conductors 143 are used in the present embodiment, three or more patterned conductors may be used.

Further, a portion, of the interconnections electrically connecting the reference terminal 122v and the capacitor 30, which is parallel to the mounting surface 40a is disposed in a path connecting one end and the other end of that portion in the shortest distance. In the present embodiment, the two patterned conductors 143 parallel to the mounting surface 40a are linearly disposed between respective one ends of the patterned conductors 143 corresponding to the reference terminal 122v and the other ends of the patterned conductors 143 corresponding to the pad electrode 42. By minimizing the lengths of the interconnections as described above, the impedance of the interconnections can be further reduced.

As described above, the semiconductor device 110 according to the present embodiment includes the IC chip 120 including the terminal array 121 that is a matrix of terminals 122 arranged in at least seven rows and at least seven columns, and the terminals 122 include the reference terminal 122v to which the reference voltage is applied. The semiconductor device 110 further includes: the capacitor 30 electrically connected to the reference terminal 122v; and the substrate 40 having one main surface as the mounting surface 40a on which the IC chip 120 and the capacitor 30 are mounted. Here, the IC chip 120 is an ASIC chip or an FPGA chip. Further, the reference terminal 122v is disposed at a position in one of the fourth and subsequent rows and one of the fourth and subsequent columns from the outer edge of the terminal array 121, and the reference terminal 122v and the capacitor 30 are connected via a plurality of parallel interconnections connected in parallel.

This increases the distance between the reference terminal 122v and the capacitor 30. However, connecting the reference terminal 122v and the capacitor 30 via the plurality of parallel interconnections connected in parallel (the two patterned conductors 143 in the present embodiment) makes it possible to reduce the impedance of the interconnections electrically connecting the reference terminal 122v and the capacitor 30.

Embodiment 3

A semiconductor device according to Embodiment 3 will be described. With the semiconductor device according to the present embodiment, similar to the semiconductor device 110 according to Embodiment 2, the reference terminal of the IC chip is disposed at a position in one of the fourth and subsequent rows and one of the fourth and subsequent columns from the outer edge of the terminal array, and the reference terminal and the capacitor are connected via a plurality of parallel interconnections connected in parallel. The present embodiment is different from Embodiment 2 in configuration of the plurality of parallel interconnections. Hereinafter, the semiconductor device according to the present embodiment will be described with reference to the drawings, focusing on the difference from the semiconductor device 110 according to Embodiment 2.

Figure 8:
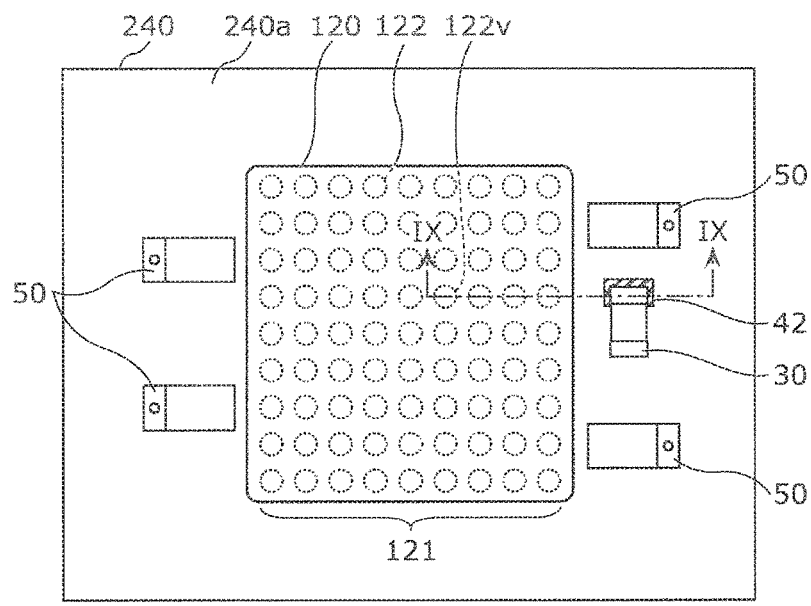
FIG. 8 is a top view illustrating the overall configuration of a semiconductor device according to Embodiment 3.
Figure 9:
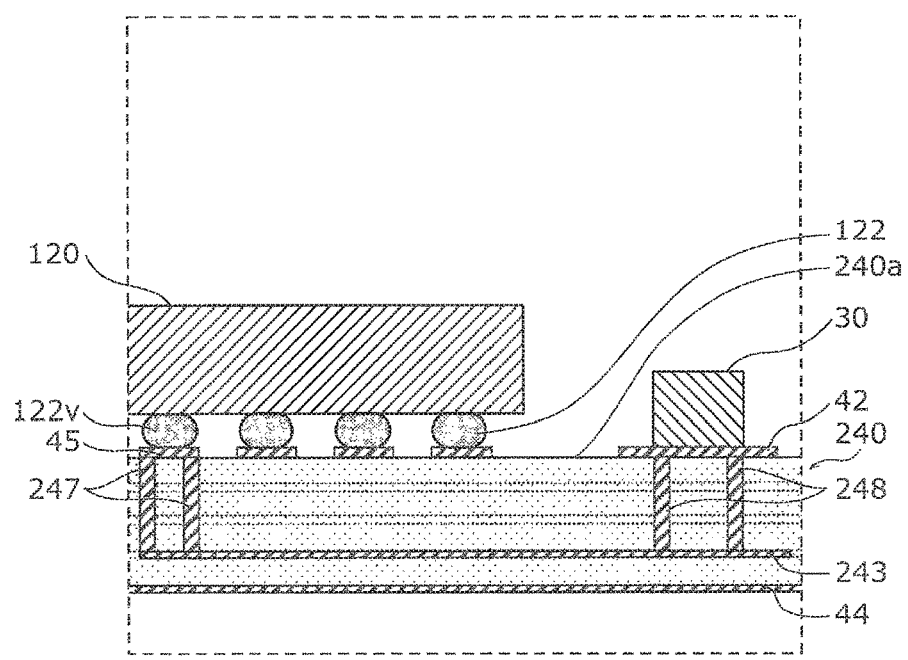
FIG. 9 is a partially enlarged cross sectional view illustrating the overall configuration of the semiconductor device according to Embodiment 3.

FIG. 8 is a top view illustrating the overall configuration of a semiconductor device 210 according to the present embodiment. FIG. 9 is a partially enlarged cross sectional view illustrating the overall configuration of the semiconductor device 210 according to the present embodiment. FIG. 9 illustrates a cross section taken along IX-IX line in FIG. 8.

As illustrated in FIG. 8 and FIG. 9, similar to the semiconductor device 110 according to Embodiment 2, the semiconductor device 210 according to the present embodiment includes the IC chip 120, the capacitor 30, arid a substrate 240. The semiconductor device 210 further includes four regulators 50. In the present embodiment too, the IC chip 120, the capacitor 30, and the regulators 50 are mounted on a mounting surface 240a of the substrate 240.

The IC chip 120 has the same configuration as the IC chip 120 according to Embodiment 2. That is to say, the IC chip 120 is an element including the terminal array 121 that is a matrix of terminals 122 arranged in at least seven rows and at least seven columns, and the terminals 122 include the reference terminal 122v to which the reference voltage is applied. The reference terminal 122v of the IC chip 120 is disposed at a position in one of the fourth and subsequent rows and one of the fourth and subsequent columns from the outer edge of the terminal array 121. In the present embodiment too, as in Embodiment 2, the reference terminal 122v is disposed at a position in the fourth row and the fourth column from the outer edge of the terminal array 121. Thus, the distance between the reference terminal 122v and the capacitor 30 is greater than the distance between the reference terminal 22v and the capacitor 30 according to Embodiment 1.

In such a configuration as above in which the distance between the reference terminal 122v and the capacitor 30 is great, in the present embodiment, as in Embodiment 2, the reference terminal 122v and the capacitor 30 are connected via a plurality of parallel interconnections connected in parallel, in order to reduce the impedance of the interconnections connecting the reference terminal 122v and the capacitor 30. In the present embodiment, at least a portion of the plurality of parallel interconnections is two via interconnections 247 and two via interconnections 248 extending in the thickness direction of the substrate 240 (the up-down direction in FIG. 9). As illustrated in FIG. 9, the interconnections connecting the reference terminal 122v and the capacitor 30 include a pad electrode 45, the two via interconnections 247, a patterned conductor 243, the two via interconnections 248, and the pad electrode 42.

The pad electrode 45 is an electrically-conductive film disposed on the mounting surface 240a of the substrate 240. The reference terminal 122v is electrically connected to the pad electrode 45.

The two via interconnections 247 are parallel interconnections connected in parallel. Each via interconnection 247 is a columnar, electrically-conductive component extending in the thickness direction of the substrate 240, and electrically connects the pad electrode 45 and the patterned conductor 243.

The patterned conductor 243 is an electrically-conductive film disposed inside the substrate 240, and electrically connects the two via interconnections 247 with the two via interconnections 248.

The two via interconnections 248 are parallel interconnections connected in parallel. Each via interconnection 248 is a columnar, electrically-conductive component extending in the thickness direction of the substrate 240, and electrically connects the patterned conductor 243 and the pad electrode 42.

The materials of the pad electrode 45, the two via interconnections 247, the two via interconnections 248, and the patterned conductor 243 are not particularly limited as long as they are electrically-conductive materials, and may be copper, for example.

As described above, with the semiconductor device 210 according to the present embodiment, the reference terminal 122v and the capacitor 30 are connected via the plurality of parallel interconnections connected in parallel, and at least a portion of the plurality of parallel interconnections are the via interconnections 247 and 248 extending in the thickness direction of the substrate 240. With this, the impedance of the interconnections between the reference terminal 122v and the capacitor 30 can be reduced to a greater extent as compared to the case of using only a single via interconnection 247 and a single via interconnection 248.

Note that although two via interconnections 247 and two via interconnections 248 are used in the present embodiment, three or more via interconnections may be used. Furthermore, although a single patterned conductor 243 is used in the present embodiment, a plurality of patterned conductors may be used to connect the two via interconnections 247 and the two via interconnections 248. This makes it possible to further reduce the impedance of the interconnections connecting the reference terminal 122v and the capacitor 30.

Embodiment 4

A semiconductor device according to Embodiment 4 will be described. The semiconductor device according to the present embodiment is different from the semiconductor device 10 according to Embodiment 1, mainly in that the semiconductor device according to the present embodiment includes a memory chip. Hereinafter, the semiconductor device according to the present embodiment will be described with reference to the drawings, focusing on the difference from the semiconductor device 10 according to Embodiment 1.

Figure 10:
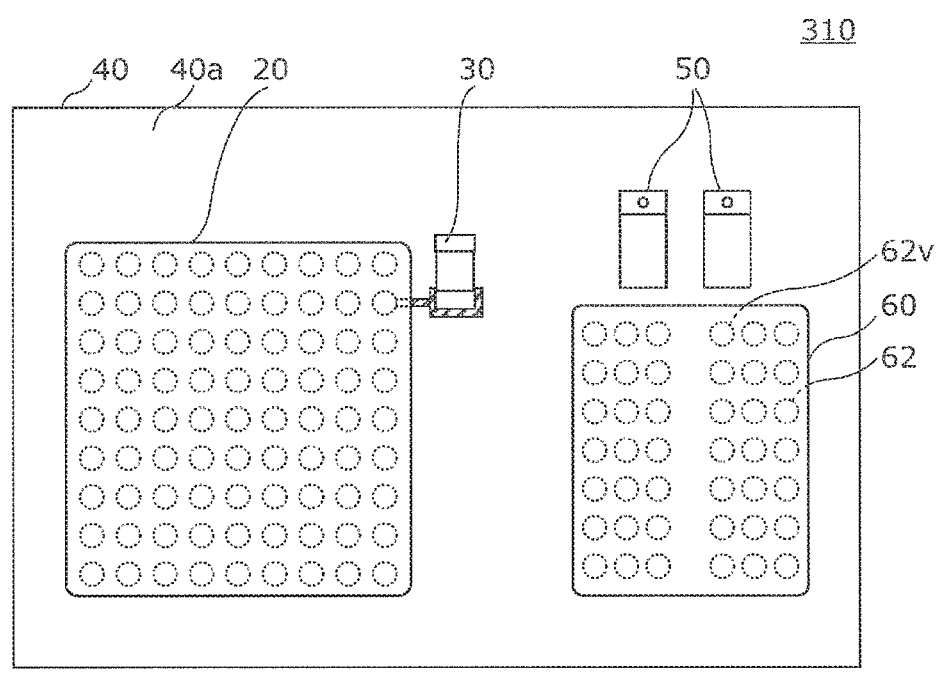
FIG. 10 is a top view illustrating the overall configuration of a semiconductor device according to Embodiment 4.

FIG. 10 is a top view illustrating the overall configuration of a semiconductor device 310 according to the present embodiment.

As illustrated in FIG. 10, the semiconductor device 310 includes the IC chip 20, the capacitor 30, the substrate 40, the regulators 50, and a memory chip 60.

In the present embodiment, the regulators 50 are mounted on the mounting surface 40a of the substrate 40, and supply the IC chip 20 and the memory chip 60 with the reference voltage.

The memory chip 60 is an element that stores a signal input from outside, and is mounted on the mounting surface 40a of the substrate 40. In the present embodiment, the memory chip 60 is DRAM, and uses, as a threshold, the reference voltage applied by the regulators 50. The memory chip 60 includes a plurality of terminals 62 including a reference terminal 62v to which the regulators 50 apply the reference voltage.

As illustrated in FIG. 10, the distance between the regulators 50 and the memory chip 60 is less than the distance between the regulators 50 and the IC chip 20. Since the lengths of interconnections between the regulators 50 and the memory chip 60 can be reduced, it is possible to reduce the noise contained in the reference voltage applied to the memory chip 60. Further, although not illustrated, the reference terminal 62v of the memory chip 60 may be connected, as with the reference terminal of the IC chip 20, to the capacitor 30 that functions as a bypass capacitor. This allows further reduction of the noise contained in the reference voltage applied to the memory chip 60.

As described above, the semiconductor device 310 according to the present embodiment includes: the memory chip 60 mounted on the mounting surface 40a; and the regulators 50 that are mounted on the mounting surface 40a and supply the IC chip 20 and the memory chip 60 with the reference voltage. Here, the distance between the regulators 50 and the memory chip 60 is less than the distance between the regulators 50 and the IC chip 20.

Since the lengths of interconnections between the regulators 50 and the memory chip 60 can be reduced, it is possible to reduce the noise contained in the reference voltage applied to the memory chip 60. This allows the memory chip 60 to operate stably.

Other Embodiments

Hereinbefore, the semiconductor device according to the present disclosure has been described based on each embodiment; however, the semiconductor device according to the present disclosure is not limited to the embodiments described above. The present disclosure also encompasses: other embodiments achieved by combining arbitrary structural elements of each embodiment; variations resulting from various modifications, to the embodiments, conceived by a person skilled in the art without departing from the essence of the present disclosure; and various devices including the semiconductor device according to the above embodiments.

For example, although a plurality of parallel interconnections connected in parallel are used in Embodiment 2 and Embodiment 3 in order to reduce the impedance of the interconnections between the reference terminal and the capacitor, the configuration of the interconnection for reducing the impedance is not limited to this. In order to reduce the impedance of the interconnection, an interconnection whose cross-sectional area (the cross-sectional area taken along a direction intersecting the direction of signal flow) is larger than the cross-sectional area of an interconnection used in other part may be used. For example, a patterned conductor having a large width in the direction intersecting the direction of signal flow may be used, and a via interconnection having a large cross-sectional area may be used.

Figure 11:
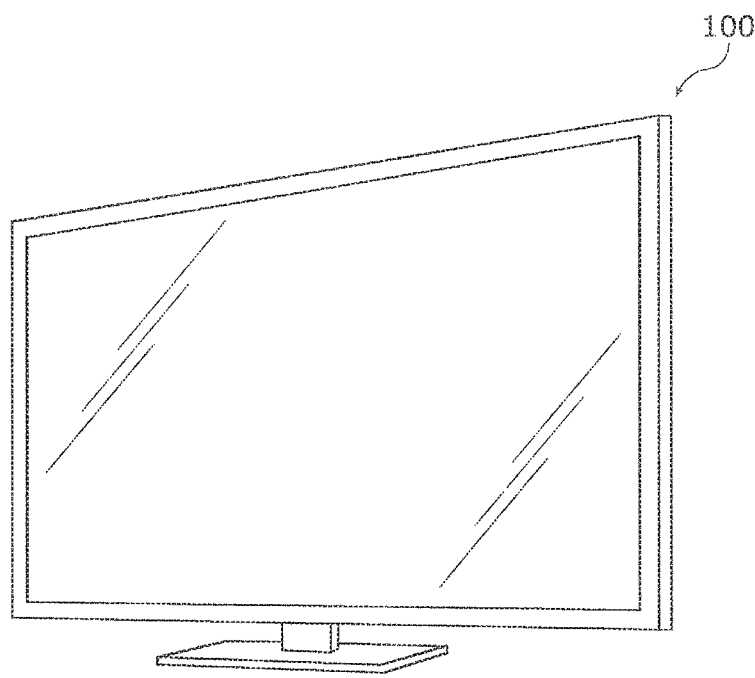
FIG. 11 is an external view of a display device including the semiconductor device according to any one of Embodiments 1 to 4.

Furthermore, the semiconductor device according to each embodiment described above is included inside a display device 100 as illustrated in FIG. 11, for example. Use of the semiconductor device according to any one of Embodiments 1 to 4 allows the memory chip such as DRAM to operate stably, and achieves a thin display device 100.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is useful for electronic devices that include a semiconductor device having an IC chip. In particular, the present disclosure is most suitable for electronic devices such as display devices required to be smaller in size and thickness.

The invention claimed is:

1. A semiconductor device, comprising:
an integrated circuit (IC) chip, configured as an application specific integrated circuit (ASIC) chip or a field programmable gate array (FPGA) chip, including a terminal array that is a matrix of terminals arranged in at least seven rows and at least seven columns, the terminals including a reference terminal to which a reference voltage is applied;
a capacitor electrically connected to the reference terminal; and
a substrate including one main surface as a mounting surface on which the IC chip and the capacitor are mounted,
wherein the reference terminal is disposed at a position within three rows or three columns from an outer edge of the terminal array, and
the reference terminal and the capacitor are connected via a patterned conductor disposed on the mounting surface.

2. A semiconductor device, comprising:
an integrated circuit (IC) chip, configured as an application specific integrated circuit (ASIC) chip or a field programmable gate array (FPGA) chip, including a terminal array that is a matrix of terminals arranged in at least seven rows and at least seven columns, the terminals including a reference terminal to which a reference voltage is applied;
a capacitor electrically connected to the reference terminal; and
a substrate including one main surface as a mounting surface on which the IC chip and the capacitor are mounted,
wherein the reference terminal is not disposed at a position in one of fourth and subsequent rows and one of fourth and subsequent columns from an outer edge of the terminal array,
the reference terminal and the capacitor are connected via a plurality of parallel interconnections connected in parallel, and
wherein the reference terminal and the capacitor are connected via a patterned conductor disposed on the mounting surface.

3. The semiconductor device according to claim 2, wherein at least a portion of the plurality of parallel interconnections is a via interconnection extending in a thickness direction of the substrate.

4. The semiconductor device according to claim 1, further comprising:
a memory chip mounted on the mounting surface; and
a regulator that is mounted on the mounting surface and supplies the IC chip and the memory chip with the reference voltage,
wherein a distance between the regulator and the memory chip is less than a distance between the regulator and the IC chip.

5. The semiconductor device according to claim 2, further comprising:
   a memory chip mounted on the mounting surface; and
   a regulator that is mounted on the mounting surface and supplies the IC chip and the memory chip with the reference voltage,
   wherein a distance between the regulator and the memory chip is less than a distance between the regulator and the IC chip.

6. A display device, comprising:
   the semiconductor device according to claim 1.

7. A display device, comprising:
   the semiconductor device according to claim 2.

\* \* \* \* \*